(12) United States Patent
Poechmueller

(10) Patent No.: US 6,975,550 B2
(45) Date of Patent: Dec. 13, 2005

(54) ARRAY TRANSISTOR AMPLIFICATION METHOD AND APPARATUS FOR DYNAMIC RANDOM ACCESS MEMORY

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 151 days.

(21) Appl. No.: 10/625,962

(22) Filed: Jul. 24, 2003

(65) Prior Publication Data

US 2005/0018469 A1 Jan. 27, 2005

(51) Int. Cl.[7] ................................................ G11C 7/06

(52) U.S. Cl. ..................... 365/208; 365/149; 365/207

(58) Field of Search ................................. 365/205, 207, 365/208

(56) References Cited

U.S. PATENT DOCUMENTS

| | | | | |
|---|---|---|---|---|
| 4,982,363 A | * | 1/1991 | Sood | ...................... 365/189.01 |
| 5,835,403 A | * | 11/1998 | Forbes | ........................ 365/149 |
| 2002/0196651 A1 | | 12/2002 | Weis | |
| 2004/0135188 A1 | * | 7/2004 | Rosa et al. | .................. 257/302 |

* cited by examiner

*Primary Examiner*—Son Mai
(74) *Attorney, Agent, or Firm*—Slater & Matsil, L.L.P.

(57) ABSTRACT

As disclosed herein, a method and apparatus are provided for amplifying a signal by a transistor of an array of transistors that includes a storage cell transistor array of a dynamic random access memory (DRAM). According to the disclosed method, an array of transistors is provided including transistors of a storage cell transistor array of a dynamic random access memory array. A transistor of the array of transistors has a source or a drain coupled to a fixed potential. An input signal is applied to a gate of the transistor, whereby the transistor amplifies the input signal to provide an output signal appearing on the other of the source or drain of the transistor.

24 Claims, 8 Drawing Sheets

ARRAY TRANSISTOR AMPLIFICATION METHOD AND APPARATUS FOR DYNAMIC RANDOM ACCESS MEMORY

BACKGROUND OF THE INVENTION

The present invention is related to dynamic random access memories (DRAMs) and more specifically to a system and method of amplifying a signal, e.g. a bitline signal, by a transistor of a DRAM array.

As the storage capacity of an integrated circuit (IC) memory is increased from one generation to the next, the sizes of memory arrays increase, as measured in terms of the row and column space of the array, i.e., the number of wordlines of the memory array, as multiplied by the number of bitlines of the memory array. Memory arrays having larger numbers of wordlines and bitlines generally have less overhead in form of support circuitry for accessing the arrays, as a percentage of the total IC area occupied by the memory. Support circuitry including row decoders, wordline drivers, column decoders, first sense amplifiers and second sense amplifiers, etc. must be provided for every memory array on the IC. However, such support circuitry takes up a significant amount of IC area that cannot be used for the storage of data. To increase the utilization efficiency of IC area, it is therefore advantageous to increase the numbers of wordlines and bitlines of each memory array relative to the numbers of circuits provided therein for support of the memory array.

In a conventional dynamic random access memory (DRAM), it is evident that a single memory array cannot have a row space including an arbitrary or unlimited number of wordlines that is served by a single set of the same bitlines, because the bitlines which span the row space would have very large capacitance. This bitline capacitance, in turn, would make the charge stored on a capacitor of a storage cell coupled to the bitline appear as an extremely small signal, making it difficult to read the storage cell. In addition, very large capacitance of the bitline would have an RC time constant which inhibits the speed of accessing cells of the memory array. Even at the scale of integration density in today's leading DRAM technology, bitline capacitance can be, for example, 200 fF, which significantly exceeds the capacitance of a storage cell within the DRAM, being, for example, 30 fF, such that bitline capacitance may soon become a limiting factor in the design of DRAMs. Thus, in currently available DRAM technology, the number of wordlines in a memory array is limited by the maximum tolerable bitline capacitance. Since the bitline capacitance is directly related to the number of wordlines in a memory array that the bitline spans, bitline capacitance has heretofore limited the size of a memory array, and has hindered the more efficient use of memory chip area, and the ratio of area used for the area memory array to the area used for support circuiting is not improving as fast as would be desired.

It would be desirable, therefore, to be able to extend bitlines of a memory array to much greater lengths than heretofore possible without causing tolerances for the bitline capacitance to be exceeded, and without significantly increasing the area required for support circuitry outside the memory array. In such way, the utilization rate of chip area for the memory array versus support circuitry can be improved.

FIG. 1A illustrates schematically, in plan view, a memory cell array of a dynamic random access memory (DRAM). As shown in FIG. 1A, a memory cell array 10 of a DRAM includes a plurality of storage cells 12, each including a capacitor 11 as a storage element and an access transistor 13 for controlling the storing and reading of a data bit to and from the capacitor 11 of the storage cell 12. A plurality of substantially parallel wordlines 14 and 15 are provided for operating the access transistors 13. A plurality of substantially parallel bitlines 16 and 17 are also provided, each coupled to storage cells 12 of the array 10 and a sense amplifier 18 for transferring a data bit signal therebetween.

In a typical read operation, a wordline 14 is activated by raising the voltage thereon to turn on transistors 13 that have gates coupled to the wordline 14, such that charge stored on capacitors 11 of storage cells 12 connected to those transistors 13 is transferred to corresponding ones of the bitlines 16. On each bitline 16, therefore, a data bit signal corresponding to one accessed storage cell is transferred to a corresponding sense amplifier 18. The sense amplifier 18 amplifies a small voltage difference signal between the bitline 16 that is currently accessed and a non-accessed bitline 17 to full high and low logic levels, thereby determining the value of the data bit read from the storage cell 12. Writeback is then usually performed from the sense amplifier 18 to the storage cell 12, because the charge stored prior thereto on the storage capacitor 11 is transferred to the bitline 16 when the data bit signal is read, and therefore no longer exists in storage capacitor 11. When a wordline 14 is activated, a bitline 16 is accessed, while bitline 17 acts only as a reference input to sense amplifier 18, such that noise that may be present on both the bitline 16 and the reference bitline 17 cancel each other out in sense amplifier 18. On the other hand, when a different wordline 15 is activated, a storage cell 12 on a bitline 17 is accessed, while bitline 16 acts only as a reference input to a corresponding sense amplifier. When both bitline 16 and reference bitline 17 are located adjacent to each other in the same array, as described here, this is known as folded bitline sensing.

A typical write operation begins by first reading the storage cell 12 that is to be written. This is performed by activating a wordline 14, which turns on all of the transistors 13 of storage cells 12 coupled to the wordline 14. This has the effect of clearing the data bit stored before that time from the storage cell 12 because the charge stored before that time in capacitors 11 of storage cells 12 coupled to that wordline 14 are transferred to corresponding bitlines 16. Signals representing data bits stored in each of the storage cells 12 coupled to the wordline 14 are then transferred on respective bitlines 16 to sense amplifiers 18 where the signals are then amplified to high and low logic levels. Thereafter, data bit signals are written to a selected set of the storage cells 12 that are accessed by the active wordline 14, while the remaining storage cells 12 accessed by the activated wordline 14 are written back from sense amplifiers 18, i.e. rewritten with the data that they stored prior to being read.

FIG. 1B schematically illustrates the configuration of a storage cell 12 of a memory array 10, in relation to which embodiments of the invention are provided. The storage cell 12 comprises a storage capacitor 22 having one plate tied to a fixed potential (typically ground as shown in FIG. 1B or in some implementations, half of the bitline high voltage) and having its other plate tied to the sources of access transistors 24. The access transistors 24 are coupled in parallel, having drains tied to bitline 16 and gates tied to wordline 14.

FIG. 1C illustrates an array of storage cells 12, which is described in commonly assigned published U.S. Patent Application No. 2002/0196651 A1 and is background to the present invention, but which is not admitted to be prior art. The illustrated cross section is shown in the direction of a bitline 16. As shown in FIG. 1C, storage capacitor 22 is formed within the deep trench 20 etched into a single crystal semiconductor of a substrate 26. A heavily doped buried strap region 28 is provided along sidewalls of deep trench 20, functioning as the source of an access transistor 24 (hereinafter, the "source"). This buried strap source region 28 is electrically connected to the node electrode 21 formed within the lower region of the deep trench 20, thus forming the connection between access transistor 24 and the storage capacitor 22. A characteristic of the arrangement shown in FIG. 1C is that the access transistors 24 are formed on both sides of deep trench 20, which provides the equivalent of twice the channel width of other transistors having comparable gate lengths. The conduction channels of access transistors 24 are formed along sidewalls of an upper region of the deep trench 20 above the buried strap source regions 28. Additionally, the gates of the access transistors 24 are formed within the upper region of deep trench 20, above the trench top oxide (TTO) 32. The drains are formed in regions on both sides of the trench 20. Deep trench 20 also includes trench collar oxide 30 and trench top oxide 32, which prevent parasitic current leakages.

The gates of access transistor 24 include a deposited doped polysilicon (hereinafter, "poly") 34 within the upper region of deep trench 20, overlying a gate oxide 36, which is formed on sidewalls in the upper region of the trench 20. As further shown in FIG. 1C, the gate poly 34 is contacted from above by an active wordline 14. Each access transistor 24 further includes a drain region 38 located at or near the top surface of the single-crystal semiconductor of the substrate. Each drain region 38 is connected to the bitline 16 via bitline contacts 23.

Note that other wordlines 15 are shown in FIG. 1C. These wordlines are connected to other storage cells, but not the storage cells being illustrated in FIG. 1C. As such, those wordlines 15 are referred to as passing wordlines as per FIG. 1C, whereas the wordline 14 contacting gate poly 34 is referred to as an active wordline. In an exemplary embodiment, wordlines 14 and 15 include a low resistance conductor layer 42 overlying an optional barrier layer, which in turn, overlies a polysilicon layer 40. For example, a wordline may include a dual layer conductor having a tungsten or tungsten silicide (WSi) layer 42 overlying a barrier layer including tungsten nitride (WN), which in turn, overlies a polysilicon layer 40. The conductive layers 40, 42 of each wordline are surrounded by a nitride insulating layer 44 to insulate the wordlines from bitline contacts 23 and the bitline 16.

The gate poly 34 is insulated from adjacent features, such as doped drain regions 38, by an insulating spacer 46 and insulating trench cap 48. Spacer 46 is preferably formed of an oxide layer and trench cap 48 is preferably formed of a nitride. Other materials could be substituted depending upon the process flow, provided adequate isolation is provided to gate poly 34. The passing wordline 15 is insulated from the doped regions 38 by an array top oxide (ATO) 39.

Referring again to FIG. 1C, note that each storage cell 12 comprises two access transistors 24. Each transistor shares a common gate poly 34, but there are two gate oxides 36, two sources 28, and two drains 38. Each drain region 38 of each transistor has two contacts 23 to the bitline 16. Each transistor 24 further shares a common drain region 38 with a neighboring transistor.

In view of the foregoing, it would be desirable to increase the length of bitlines or permit bitline capacitance to increase, while providing a way for bitline signals to be distinguished, and without having to increase the access time of the memory array.

It would further be desirable to amplify a bitline signal locally, by a transistor of an array of transistors including a storage cell transistor array spanned by the bitline.

It would further be desirable to construct an amplifier including a transistor of an array of transistors including a storage cell array transistor.

It would further be desirable to fabricate the transistor of such amplifier within the same well within which transistors of an array of transistors of a memory are provided.

SUMMARY OF THE INVENTION

According to an aspect of the invention, a method and apparatus are provided for amplifying a signal by a transistor of an array of transistors that includes a storage cell transistor array of a dynamic random access memory (DRAM). An array of transistors is provided including transistors of a storage cell transistor array of a dynamic random access memory array. A transistor of the array of transistors has a source or a drain coupled to a fixed potential. An input signal is applied to a gate of the transistor, whereby the transistor amplifies the input signal to provide an output signal appearing on the other of the source or drain of the transistor.

DETAILED DESCRIPTION

Figure 2A:
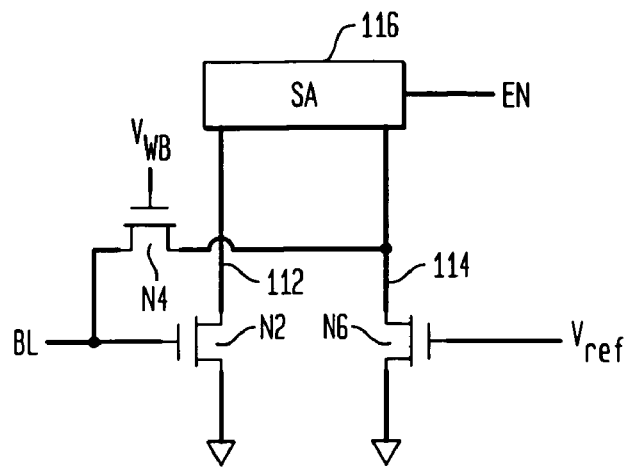
FIGS. 2A through 2C illustrate alternative circuit embodiments of the invention.
Figure 2B:
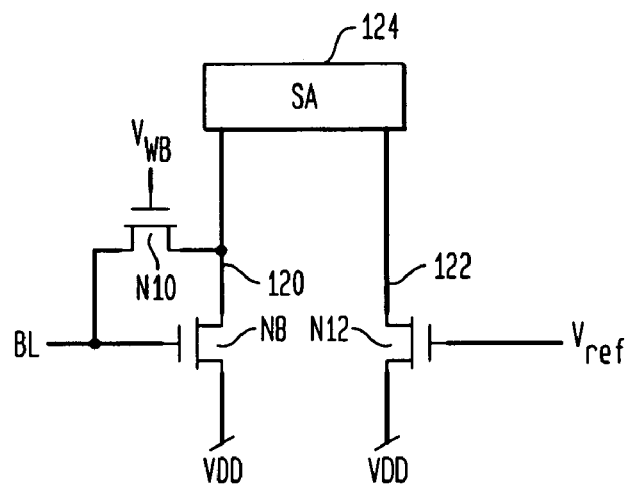
Figure 2C:
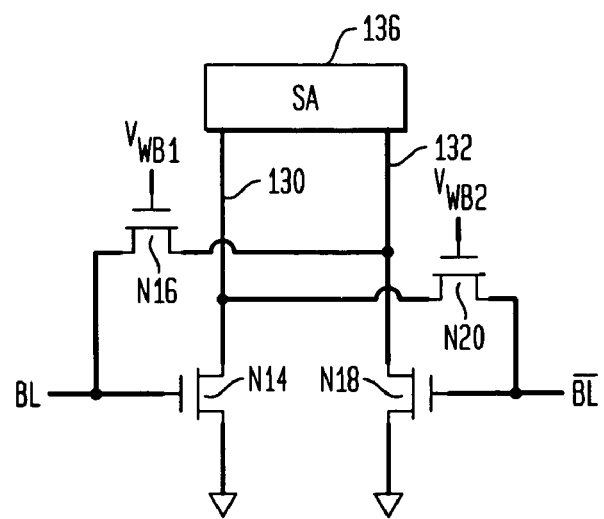

FIGS. 2A, 2B and 2C illustrate alternative versions of a first circuit embodiment of the invention in which a transistor of an array of transistors including a storage cell transistor array is operable to amplify a signal on a bitline of the storage cell array and to provide amplified output to a sense amplifier.

As shown in FIG. 2A, in a first alternative version, a bitline signal is input to the gate of an n-type conductivity field effect transistor (hereinafter, NEET) N2, in which the source is coupled to a fixed potential, for example ground, as shown in FIG. 2A, and the drain 112 is coupled to a sense amplifier 116. In FIG. 2A, NFET N2 and at least NFET N4 are transistors of an array of transistors including a storage cell transistor array of the memory. Thus, as will be described in more detail below, N2 and N4 are located within the same transistor array in which transistors of the storage cell array are located, and are fabricated in essentially the same manner as these transistors, as will be described with reference to the exemplary implementation in FIGS. 3A–3C below. Hereinafter, transistors which are labeled with an "N" preceding a number shall be understood to be NFETs. In this configuration where the source of the NFET is coupled to ground, the voltage appearing at the drain of N2 is inverted relative to the voltage applied to its gate. The voltage appearing at the drain 112 of N2 is also an amplified output of transistor N2 because a small change in the voltage applied to the gate of transistor N2, e.g. from a value just below the threshold voltage of N2 to a value above the threshold voltage, causes the voltage at the drain 112 to change from its prior level to ground, as the transistor changes to a conductive state.

The output of transistor N2 is, therefore, an amplified inverted version of the bitlines signal input thereto. This inverted signal is applied by a conductive line 112 to a sense amplifier 116. Sense amplifier 116, which is desirably a differential sense amplifier, requires a second input as a reference signal, in relation to which the amplified bitline signal at the output of N2 is sensed. As shown in FIG. 2A, the reference signal is generated in a manner similar to the amplified bitline signal, by an NFET N6, the source of which is coupled to ground, and the gate of which receives a reference voltage Vref. Accordingly, the voltage at the drain 114 of N6, i.e. the output of N6, is inverted relative to the voltage at the input, i.e. the gate of N6.

The value of Vref is selected based on the value of the threshold voltage of NFETs in the array of transistors, such that Vref biases N6 at a voltage which neither fully turns on N6, nor turns it off completely. Thus, when the bitline voltage BL applied to the gate of N2 is higher than Vref, the output voltage 112 of N2 is driven towards ground, while the output voltage 114 of N6 remains higher than ground. Conversely, when the bitline voltage BL applied to the gate of N2 is lower than Vref, the output 114 of N6 is driven towards ground, while the output 112 of N2 remains higher than ground.

The embodiments shown herein can be used to increase the overall gain in amplifying bitline signals of the storage cell array, since signals are amplified before reaching the sense amplifier 116. Therefore, a higher bitline capacitance can be tolerated, as it is overcome by the increased system gain.

On the other hand, the embodiment shown herein can be placed at one or more locations along the length of a bitline within a storage cell array, thus breaking up a long bitline, having a corresponding high capacitance, into several smaller sections of the bitline which have more manageable capacitance values. In such manner, a large storage cell array can be fabricated having long bitlines, and the embodiments herein can help overcome the above-described difficulties due to high capacitance.

Sense amplifier 116, which is coupled to the outputs 112, 114 of N2 and N6, operates as follows. During a precharge interval prior to sensing, the bitline voltage BL is allowed to float while Vref is held constant at a DC reference voltage. At that time, the outputs 112, 114 of transistors N2 and N6 are precharged to an initial level, being, for example, an intermediate level (e.g. Vdd/2) that is between the logic high (e.g. Vdd) and logic low (e.g. ground) levels of the lines 112, 114 coupled to the sense amplifier 116. Thereafter, when the precharge phase has ended, a storage cell of the storage cell array is accessed by the bitline BL, which then causes a signal to develop on line 112, by the amplification of transistor N2 as described above. When the bitline voltage BL is high, being greater than Vref, transistor N2 will be biased at a point which is more conductive than transistor N6. Consequently, the voltage on line 112 will fall lower than the voltage on line 114. During this phase of operation, a voltage difference develops between lines 112 and 114 which need only be a relatively small fraction (e.g. ⅒ to ⅓) of the total rail-to-rail voltage difference between the logic high and logic low levels of the sense amplifier 116.

After the voltage difference signal develops between lines 112, 114, an enable signal EN is then provided to the sense amplifier 116, which, in turn, amplifies the voltage difference signal on lines 112, 114 to full rail-to-rail levels, e.g. Vdd and ground. Rail-to-rail voltage levels are then present on lines 112 and 114, one of the lines being at the voltage Vdd, for example, and the other line being the complementary voltage, i.e. at ground.

Thus, in the above example, when the bitline voltage BL is high, the voltage difference signal develops such that the voltage on line 112 is lower than line 114, and thereafter, the sense amplifier 116, when enabled, amplifies that signal to ground on line 112 and amplifies the signal to Vdd on line 114.

Next, operation will now be described during a writeback phase of operation of sense amplifier 116. As described above, it is clear that the bitline BL is not conductively connected to the sense amplifier 116 during the signal development and signal amplification phases of operation. However, the bitline must be conductively connected to the sense amplifier during writeback (and writing) phases of operation in order to transfer charge to write the accessed storage cell. Since line 112 carries an inverted amplified version of the bitline voltage signal, and the signal on line 114 is the complement of the signal on line 112 (i.e. an inverted version of the signal on line 112), it follows that line 114 carries a non-inverted, amplified version of the signal on bitline BL.

Accordingly, transistor N4 conductively connects the bitline BL to line 114 during writeback and write phases of operation to write an amplified full logic level version of the bitline signal to the bitline BL. A control input $V_{WB}$, active during a writeback phase of an operation, and during write operations, turns on transistor N4 to drive the voltage on bitline BL to the level of the line 114 at such times. The writeback voltage $V_{WB}$ turns off transistor N4 during the signal development and signal amplification phases of operation of sense amplifier 116. In a preferred embodiment, the control input $V_{WB}$ remains active during a precharge phase of an operation after the writeback operation, to allow the bitline BL to be precharged by sense amplifier 116 to a suitable precharge level prior to the beginning of the signal development phase of the next read or write operation on the bitline BL.

The operation of the embodiment shown in FIG. 2A will now be described. Operation begins with the precharging of at least lines 112 and 114 to suitable levels, such as an intermediate voltage level Vdd/2 halfway between the rails of the sense amplifier 116, i.e. ground and Vdd. At the time of precharging, wordlines of the memory array are inactive. In a preferred embodiment, the voltage $V_{WB}$ provided to transistor N4 is active during the precharge phase, such that bitline BL is also precharged to a desirable level such as Vdd/2.

Next, a wordline of the storage cell array is activated, and the charge representing a data bit stored in a storage cell accessed by the wordline is transferred onto the bitline connected thereto, which then appears at the gate of transistor N2. This begins the signal development phase of sensing. Depending on the polarity of the data bit (i.e. "0" or "1") accessed from the storage cell by the bitline, the bitline voltage BL input to transistor N2 is either lower or higher than Vref. For example, when the bitline voltage BL is lower than Vref, transistor N2 is less conductive than transistor N6, and therefore, line 114 is driven lower by transistor N6, the source of which is coupled to ground. Line 112, by comparison, remains at Vdd/2, or may start to drift upward. Thus, it can be seen that line 112 provides an amplified inverted version of the bitline voltage BL, while line 114 represents an amplified non-inverted version of the bitline voltage BL. At this time, the voltages on lines 112 and 114 may not be more than a fraction of the rail-to-rail difference in voltages between the full logic high and logic low levels of the sense amplifier 116. This concludes the signal development phase.

Next, the sense amplifier 116 is enabled, and then amplifies the voltage difference signal between lines 112 and 114 to a full rail-to-rail signal, with the voltage on line 114 representing the "true" state of the accessed storage cell by the bitline, and the voltage on line 112 representing its complement, i.e., the inverted form. These voltages are then available to be transferred as output to other circuitry of the memory, e.g. during a read operation, or can merely serve in regenerating the logic level of the data bit that has been accessed from the storage cell array, as in a refresh operation, or a writeback operation, after the particular storage cell has been accessed.

Thereafter, while the wordline remains active, the control signal $V_{WB}$ is raised at the input to transistor N4, which then transfers the signal on line 114 to the bitline BL to write the regenerated data bit signal back to the storage cell accessed by the bitline BL. The sense amplifier 116 drives the voltage on line 114 for a sufficient period of time to write back the data bit signal to the storage cell accessed by the wordline, and then the wordline is deactivated again. Such concludes an operation of reading a data bit from a storage cell accessed by the wordline and bitline combination.

In a case in which the storage cell is written, most of the steps performed are the same as those described above for reading, except that at or just after the time that the signals develop on lines 112 and 114, the sense amplifier 116 drives the level on line 114 to that of the new data bit to be written to the bit line, and drives the level on line 112 to the complement of the new data bit. In such write operation, the control signal VWB can be activated at the time of or sooner than during the writeback phase described above, such that the sense amplifier 116 drives the voltage on the bitline BL to the level of the new data bit being written. After sufficient time has elapsed to write the new data bit to the accessed storage cell, the wordline and the control signal $V_{WB}$ are both deactivated, and a precharge phase begins for the next operation. Such concludes a write operation to a storage cell of a storage cell array.

FIG. 2B illustrates an alternative version of the embodiment shown in FIG. 2A. The version shown in FIG. 2B is similar to the version of FIG. 2A, except that the sources of transistors N8 and N12 are coupled to a supply voltage Vdd instead of ground as in FIG. 2A, and the writeback path to the bitline BL is from a line 120 coupled to the output of a transistor N8, to the gate of which the bitline voltage BL is applied. The reference voltage Vref, and a preferred scheme of precharging the lines 120 and 122 to Vdd/2 are as described above relative to FIG. 2A.

However, in this embodiment, because the source of transistor N8 is coupled to Vdd rather than ground, the output of N8 appearing on line 120 is a non-inverted version of the bitline signal BL. Thus, when the bitline voltage VL is higher than Vref during a signal development phase, transistor N8 becomes more conductive than transistor N12, and therefore, at that time, line 120 is driven higher than line 122 by the supply voltage Vdd. Next, in a signal amplification phase, the sense amplifier 124 amplifies the signal on line 120 to Vdd, while the signal on line 122 is driven to ground. After line 120 has been driven to Vdd, the control signal $V_{WB}$ is activated during a writeback phase of operation, which then turns on transistor N10 to drive the voltage on bitline BL to the regenerated logic high signal Vdd which is then present on line 120. This concludes a memory access operation according to the version shown in FIG. 2B.

Figure 1A:
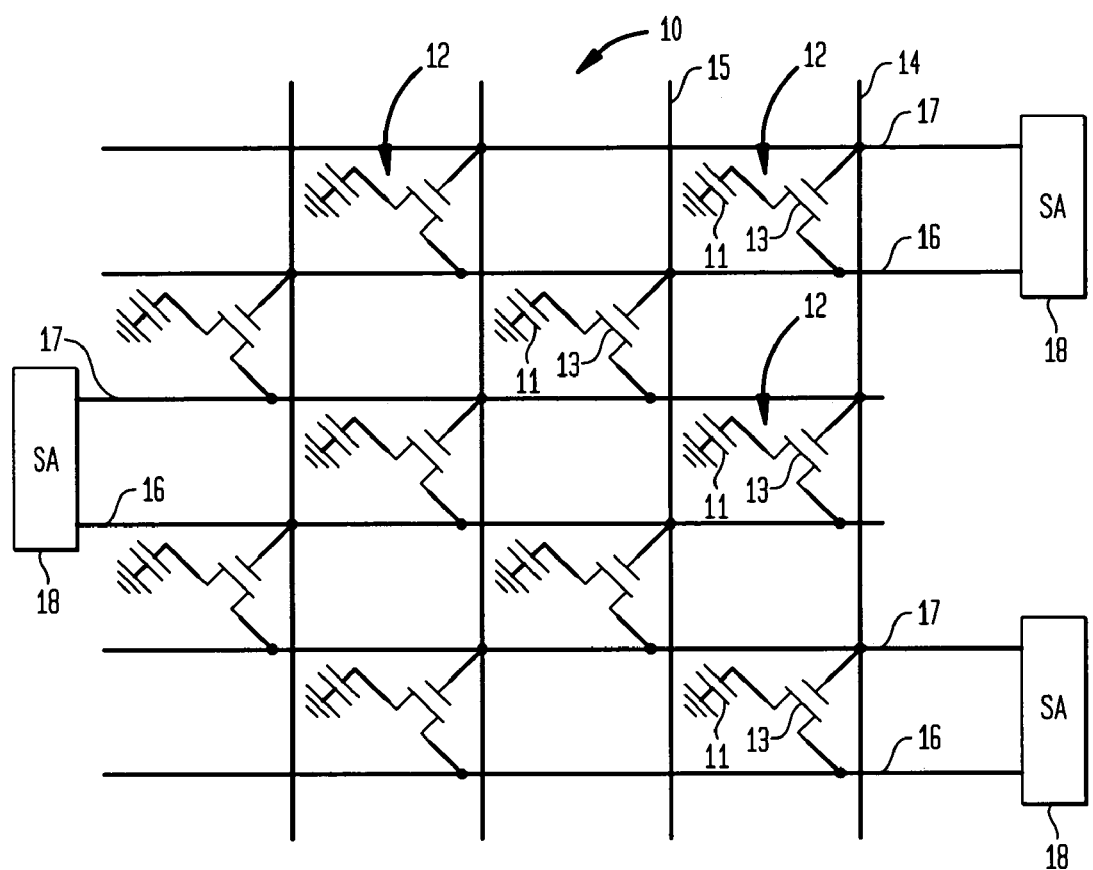
FIG. 1A is a schematic diagram illustrating a prior art storage cell array having a folded bitline arrangement.
Figure 1B:
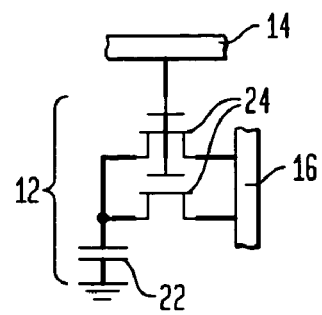
FIGS. 1B and 1C are diagrams illustrating a particular storage cell structure of a DRAM which is background to the present invention but is not admitted to be prior art.
Figure 1C:
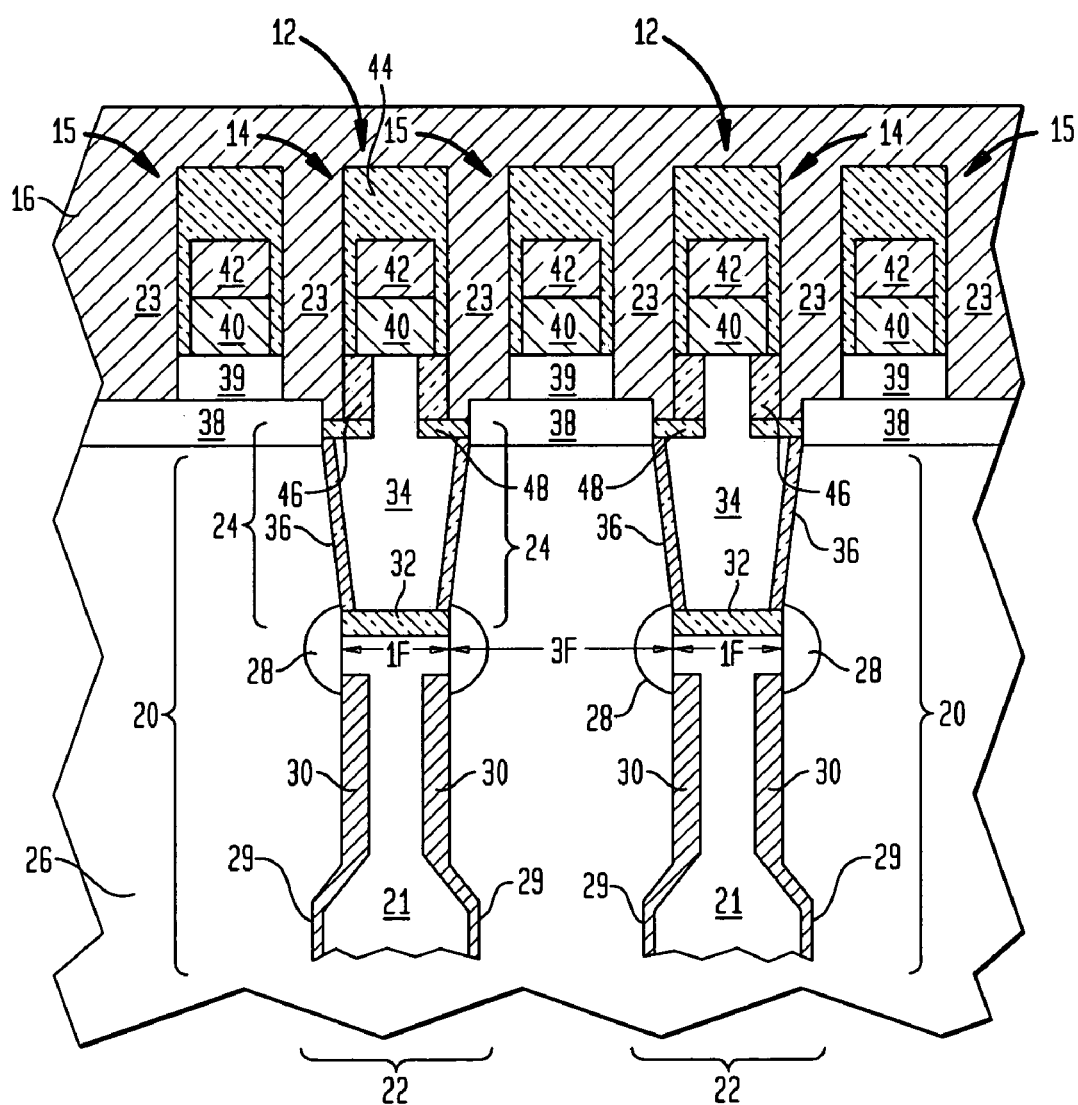

Still another version of the embodiment shown in FIG. 2A is provided in FIG. 2C. In this version 1 rather than using an arbitrary fixed reference voltage Vref to generate an output on line 132 for comparison by sense amplifier 136 with the voltage on line 130, the reference voltage is provided by a non-accessed bitline (/BL) of the storage cell array. The non-accessed bitline /BL acts as a reference bitline which is allowed to float at the time that the active bitline voltage BL is input to transistor N14. The non-accessed bitline (/BL) can be an adjacent bitline of the same storage cell array as the bitline BL, when the storage cell array is a folded bitline array, as is bitline 17 described above relative to FIG. 1A. Such is a preferred arrangement for common mode noise rejection, since the non-accessed bitline /BL crosses the same space of the storage cell array, and is thus subject to the same sources of noise and interference as bitline BL. In a folded bitline array, depending on the wordline that is accessed, when a storage cell on a bitline BL is accessed, bitline /BL is non-accessed. Conversely, at other times, a storage cell on a bitline /BL is accessed, at which times the bitline BL becomes the non-accessed bitline.

In a particular embodiment according to FIG. 2C, control signals $V_{WB1}$ and $V_{WB2}$ are the same, such that they can be brought into the transistor array on a single line, thus saving wiring complexity and possibly chip area. Then, when a storage cell accessed by a bitline BL is written back, both control signals $V_{WB1}$ and $V_{WB2}$ are activated, such that sense amplifier 136 drives the signal levels on both lines BL and /BL to the levels of the lines 132 and 130, respectively. However, this is not a preferred arrangement, since much power is consumed in driving the signal level on a non-accessed bitline, which signal level will only have to be driven back to a different level (e.g. Vdd/2) in a precharge phase for the next read or write operation involving the storage cell array.

In a preferred embodiment, the control signals $V_{WB1}$ and $V_{WB2}$ are two different control signals for controlling writeback operation through transistors N14 and N18. Thus, when a data bit in a storage cell accessed by a bitline BL is written back, control signal $V_{WB1}$ is activated and $V_{WB2}$ is deactivated. Otherwise, when a data bit in a storage cell accessed by a bitline /BL is written back, control signal $V_{WB2}$ is activated and $V_{WB1}$ is deactivated. In such way, the sense amplifier 136 only drives the signal level on a bitline that is currently accessed, to write the data bit back to a storage cell, and avoids driving the signal level on the non-accessed bitline, thus saving power in the storage cell array.

Figure 3A:
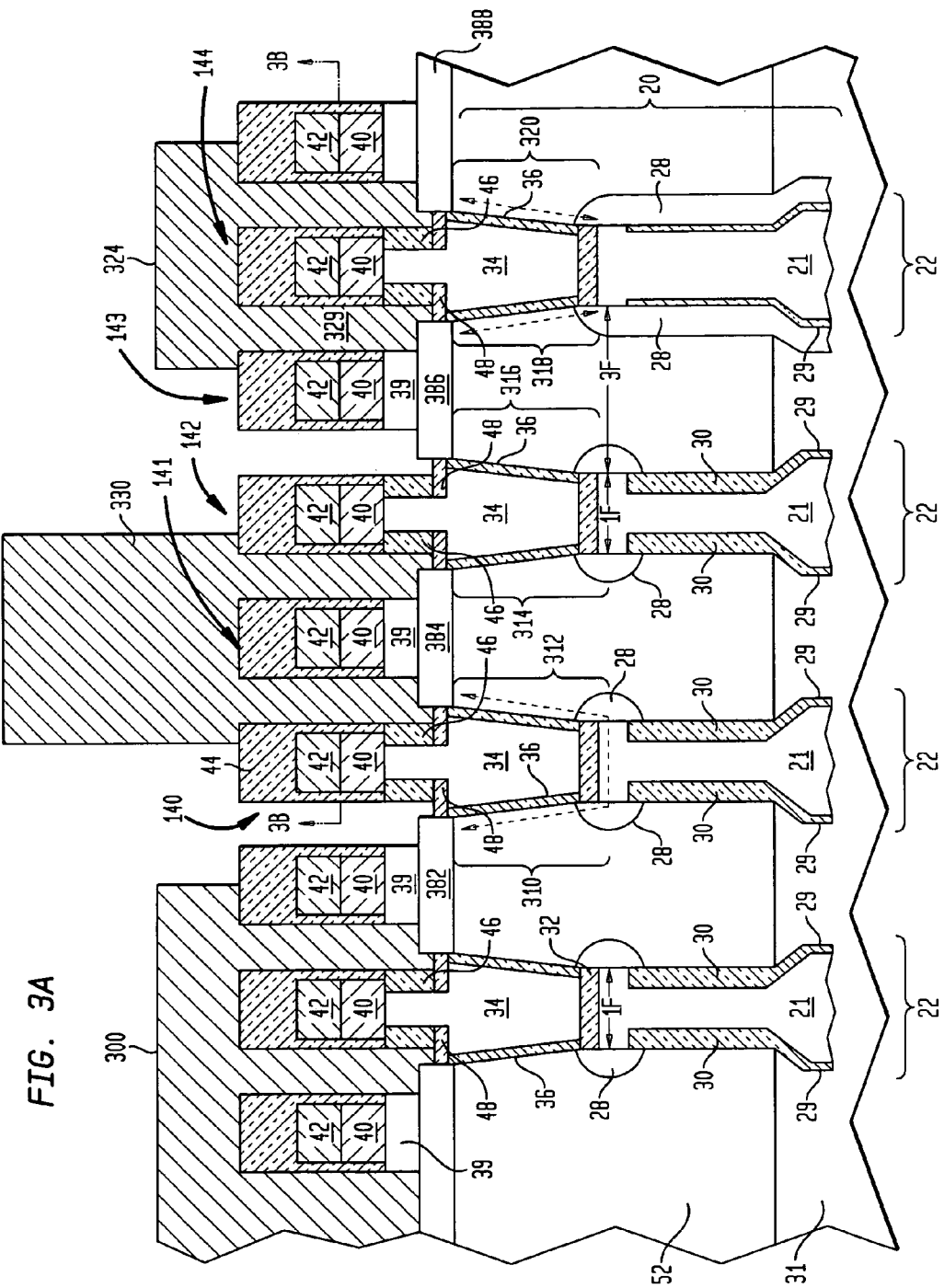
FIGS. 3A and 3B are a cross-sectional diagram and corresponding plan view, illustrating an implementation of the circuit embodiment of the invention shown in FIG. 2A.

FIG. 3A illustrates, in cross-section, an implementation of the circuit embodiment of the invention shown and described above relative to FIG. 2A. As shown in FIG. 3A, the circuit embodiment is implemented by transistors of an array of vertically oriented transistors. The array of vertically oriented transistors provide both the function of amplifying a signal according to the invention, as well as the access transistors of individual storage cells of a storage cell array. Preferably, all transistors of the array of transistors, including the storage cell array, are formed within the same well 52 of the semiconductor substrate, i.e. the well within the storage cell array is formed, so as to conserve chip area. This is advantageous over an arrangement that would require transistors to be located in separate wells, as a buffer space is generally required between neighboring wells, consuming much area.

As shown in FIG. 3A, a pair of vertically oriented transistors 318, 320, having sources tied to ground through an extended buried strap/buried plate region 28 of a trench 20, are operated by a conductor line 144 which contacts the gates 34 of both transistors from above. The conductor line 144 applies a signal from a bitline 300 to the gates 34 of the transistors 318, 320. The output of transistors 318, 320, at drains 386 and 388, is conductively coupled by a contact 324 to a sense amplifier at a far end. Transistors 318, 320 which have sources tied to ground, having gates tied to a bitline signal input, and the output at drains 386, 388 coupled to a line 324 to a sense amplifier, fulfill the role of transistor N2 of the circuit embodiment shown in FIG. 2A.

When transistors 318, 320 are turned on by a high level signal on bitline 300, the line 324 is discharged towards ground by the transistors 318, 320, and a low level signal is provided to the sense amplifier 116 at the far end of the line 324. Conversely, transistors 318, 320 remain off when a low level signal is provided to the gates thereof through bitline 300. Under such condition, a higher level output from the transistors 318, 320 through line 324 is provided to sense amplifier 116.

The following is provided for the writeback portion of the circuit. A bitline 300 is coupled to the drain of a first vertically oriented transistor 310 provided on the sidewall of a trench. The trench includes a second vertical transistor 312, which, in this arrangement, operates in series with transistor 310, as connected by node conductor 21 between the two buried strap source regions 28. These series-coupled transistors 310, 312 correspond to the transistor N4 of FIG. 2A. Both transistors 310 and 312 are operated by a voltage on a conductor line 140, which is coupled to the gates 34 of these transistors. Another signal conductor 330 (corresponding to line 112 of FIG. 2A) contacts the drain of transistor 312 and is coupled to a sense amplifier 116 (FIG. 2A) as a signal complementary to the signal on line 324. Transistor N6 of FIG. 2A is not shown in FIG. 3A, since it is desirably provided at or near the location of the sense amplifier 116, where transistors can be coupled to a reference voltage Vref from outside the memory array preferably serving many sense amplifiers and wiring is therefore made simpler.

Figure 3B:
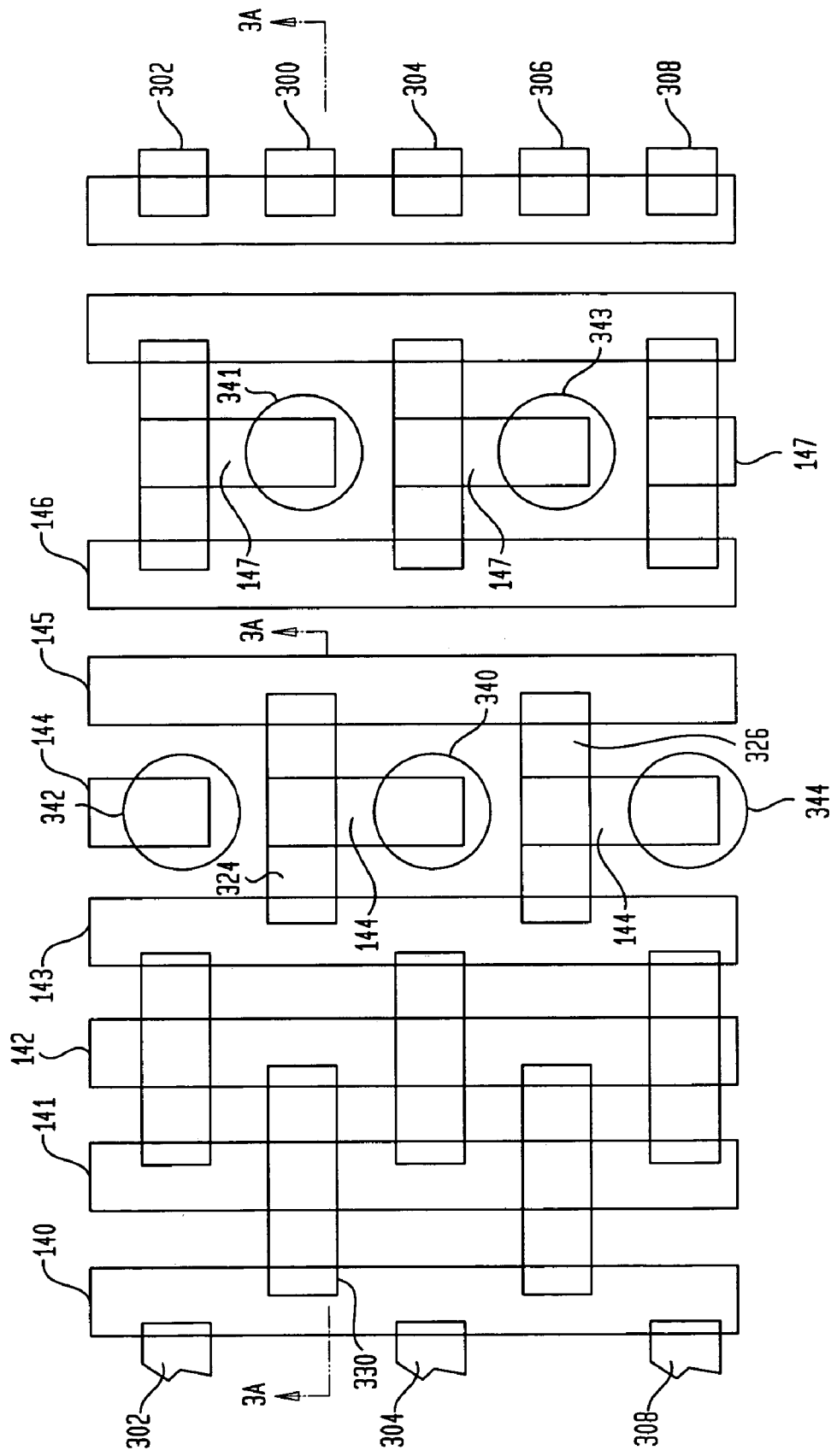

FIG. 3B provides a plan view of the embodiment. FIG. 3A is a cross-sectional view provided through line 3A-3B of FIG. 3B. As shown in FIG. 3B, a conductive contact 330 is located over a passing conductor 141. An active conductor 140 at that location carries the $V_{WB}$ control signal to operate transistors 310 and 312 shown in FIG. 3A. Conductive contact 324 is located over the active conductor 144, that conductor 144 providing the signal from bitline 300 as input to the gates of transistors 318 and 320.

As shown in FIG. 3B, a preferred way in which a bitline is connected to conductor 144 is through a vertical conductive contact 340. Such contact is made from a wiring level higher than that shown in FIG. 3B, e.g. an M1, or M2 level by etching a contact hole down to the metal 42 of the conductor 144. Such etch can be performed by a reactive ion etch, selective to the metal of the conductor line and selective to silicon, so as to remove the overlying dielectric material including insulating layer 44, while preserving the conductor and polysilicon material of the conductor 144 and the surrounding areas of the substrate. It is evident that the conductor 144 cannot be formed as a continuous line feature, as the other conductors are, e.g. 140–143 of FIG. 3B, because different bitlines, e.g. bitlines 302, 304, 308 of the array, need to be connected to a conductor line 144 to apply a respective bitline signal to the respective transistors, e.g. transistors 318, 320, of the array. Thus, an isolating gap is shown in the conductor 144 between the vertical contact 340 and the adjacent contact 326 that carries an amplified bitline signal output from array transistors to another sense amplifier 116.

In addition, a staggered arrangement is used for placing vertical contacts to the conductors 144 and 147 of the transistor array, such that vertical contacts 340, 342, and 344 are made to conductors 144, while vertical contacts 341, 343 are made to conductors 147. The vertical contacts must be staggered between two different conductors 144 and 147 because each vertical contact is made at a location of a conductor 144 or 147 which overlies the array top oxide as a "passing conductor", insulated from the transistor array at that location.

Figure 3C:
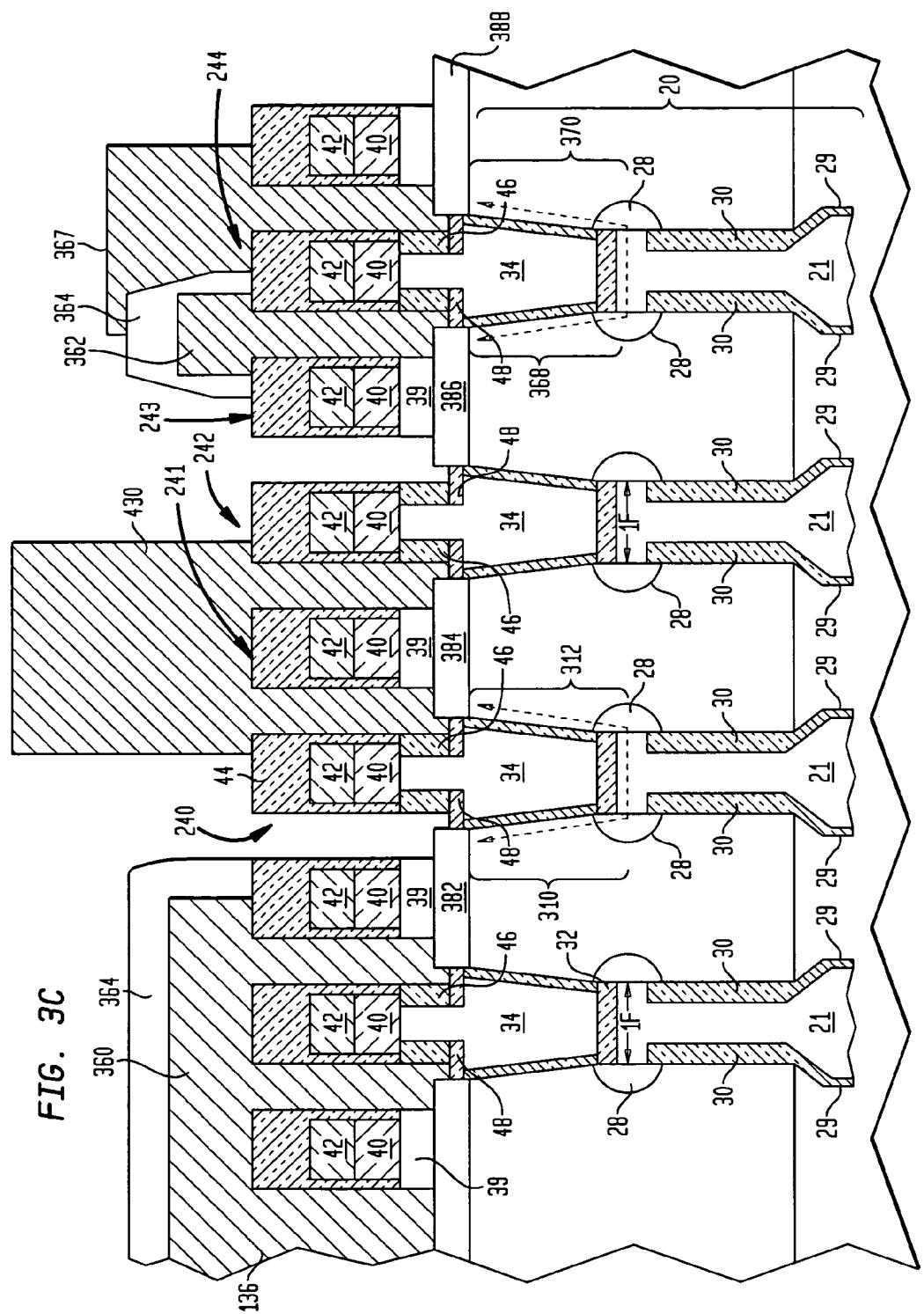
FIG. 3C is a cross-sectional view illustrating an implementation of the circuit embodiment of the invention shown in FIG. 2B.

FIG. 3C is a cross-sectional view illustrating an alternative embodiment of the invention corresponding to FIG. 2B, in which a transistor N8 is coupled between a fixed potential other than ground, such as a supply voltage Vdd. In this embodiment, a bitline 360 is formed in like manner to a bitline 300 as described above relative to FIGS. 3A-3B, and is conductively coupled to the conductor line 244 as shown and described above relative to FIG. 3B. When bitline 360 is formed, a Vdd voltage supply contact 362 is also formed, contacting to a drain of a vertical transistor 368 within a trench 20.

Thereafter, the bitline 360 and the voltage supply contact 362 are insulated by depositing a material, e.g., silicon nitride, and vertically etching the structure, as by a reactive ion etch (RIE), to form an insulating layer 364 over the respective bitline 360 and voltage supply contact 362. Afterwards, an interlevel dielectric layer is deposited to fill the spaces between features up to and over bitline 360 and voltage supply contact 362. Thereafter, a vertical contact hole is etched, borderlessly to the voltage supply contact 362, selective to the material of the insulating layer 364. A conductive material is then deposited to make a conductive contact 367 to the output of the series transistor pair 368, 370, that contact 367 coupled at a far end to a sense amplifier. Conductive contact 430 is formed simultaneously with contact 367 by a process of etching a vertical contact hole in the interlevel dielectric layer, and depositing a conductive material therein, the contact 430 being coupled to a true input of a sense amplifier. Conductive contact 430 performs the same function as contact 330 shown in FIG. 3A, namely gating a writeback signal from the sense amplifier to the bitline during a writeback phase, except that the contact 430 is coupled to a true, i.e. non-inverted, line to and from the sense amplifier, as the polarity of the amplified signal on line 367 is non-inverted.

Figure 4A:
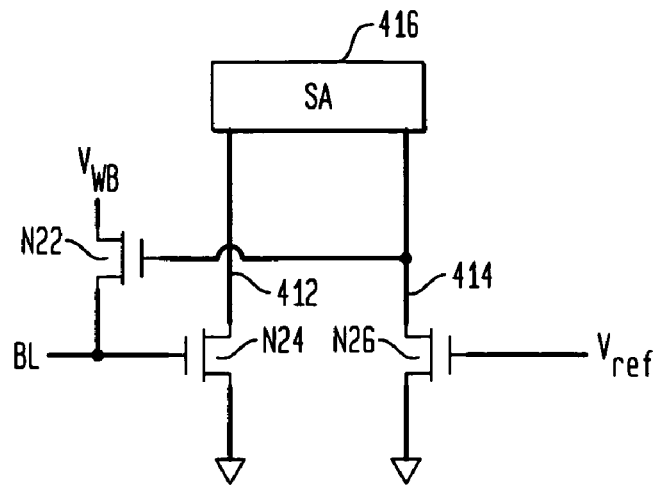
FIGS. 4A through 4C illustrate circuit embodiments of the invention having a modified writeback arrangement.
Figure 4B:
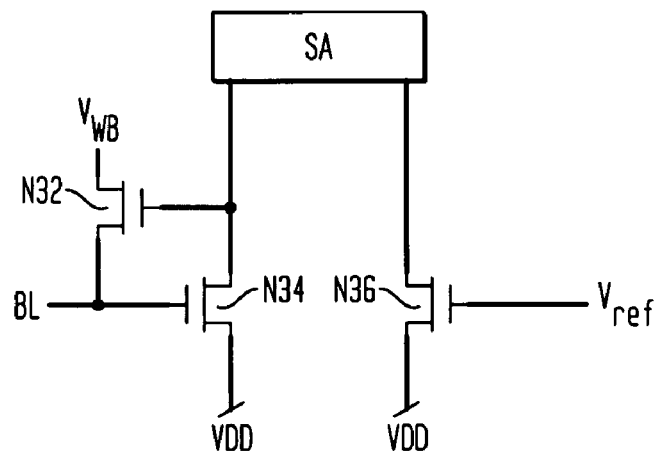
Figure 4C:
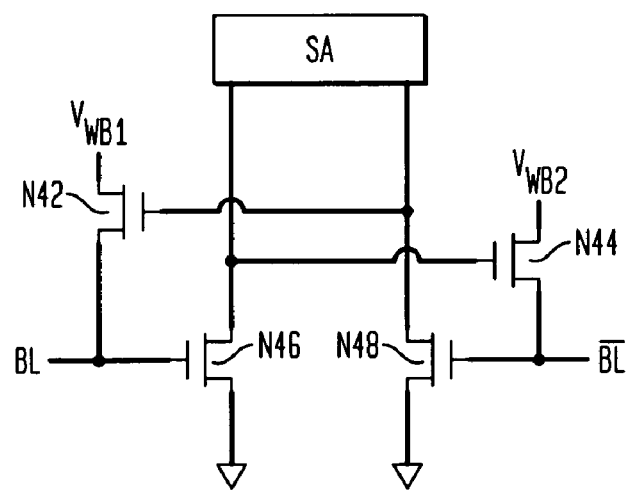

FIGS. 4A through 4C illustrate alternative circuit embodiments of the invention in which the writeback transistor in each, i.e. transistors N22, N32, and N42 are configured differently so that they do not transfer current between the sense amplifier and the respective bitline in each case, but rather, supply current selectively from a $V_{WB}$ supply to the bitline, when the state of the particular bitline to be written (or written back) in each case is a high level (i.e., a "1"). With the exception of this change, these embodiments correspond to the respective above-described embodiments described above relative to FIGS. 2A–2C.

Thus, for example, in the embodiment shown in FIG. 4A, $V_{WB}$ is raised high at time of writeback, but at other times, i.e. during precharge, signal development, and signal amplification phases of the operation of sense amplifier 416, is held at an intermediate voltage such as Vdd/2, so as to allow the signal voltage on the bitline BL to be precharged, develop and be amplified.

In a read operation, when the bitline voltage BL is high, i.e. above Vref, NFET N24 becomes more conductive than NFET N26, such that when the sense amplifier 416 is enabled at the start of the signal amplification phase, the line 412 is driven to ground, while the line 414 is raised high. At the start of the signal amplification phase of the read operation, the writeback voltage $V_{WB}$ is raised high. Consequently, the writeback voltage $V_{WB}$ is applied to the bitline BL, beginning at the moment that the voltage on line 414 rises above the threshold voltage of transistor N22. Thus, the transistor N22 operates in a self-timed manner, since its action in raising the voltage on the bitline BL is timed by the change in voltage on line 414, not by a timed $V_{WB}$ signal to transistor N22. This allows the writing of a '1' to the memory to begin sooner than in the above-described embodiment (FIG. 2A), allowing a stronger '1' to be written.

In the embodiments shown in FIGS. 4A–4C, $V_{WB}$ is set to the desired bitline high level $V_{b1h}$ for storing a "1" into a storage cell 12 of the memory cell array 10. In order for such voltage to be transferred by an NFET N22 (FIG. 4A) to a storage cell 12, the power supply voltage ($V_{DD}$), to which a sense amplifier 416 charges line 414, must be greater than or equal to $V_{b1h}$ plus the threshold voltage $V_T$ of NFET N22. For example, if $V_{b1h}$ is equal to 1.4 V, and $V_T$ is 0.6, then the high level voltage of line 414 $V_{DD}$ should be at least 2.0 V, and is desirably somewhat greater, e.g. 2.1 V.

On the other hand, when performing a read operation when the bitline voltage BL is lower than Vref, the line 414 will be driven to ground when the sense amplifier 416 is enabled. In such case, the voltage on line 414 will be insufficient to turn on transistor N22, and therefore, the bitline voltage BL will be allowed to float. In consequence, the storage cell accessed by the bitline will be written back to a level that is lower than the high level rail of the sense amplifier 416, but not necessarily ground, as before. While only weaker "0" signals can be written to a storage cell in this scheme, the stronger '1' that can be written using this scheme results in good signal differentiation.

Figure 5A:
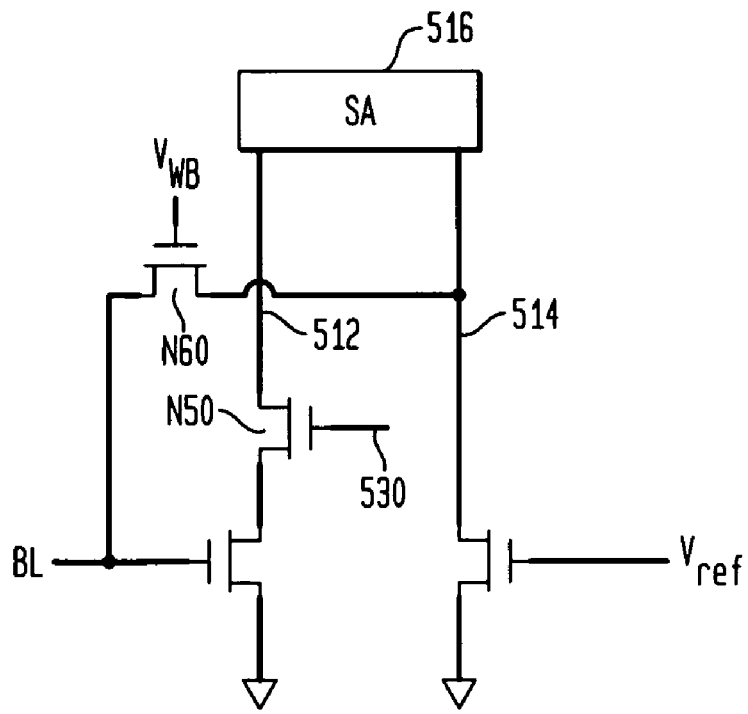
FIGS. 5A and 5B illustrate circuit embodiments of the invention in which a select transistor is provided.
Figure 5B:
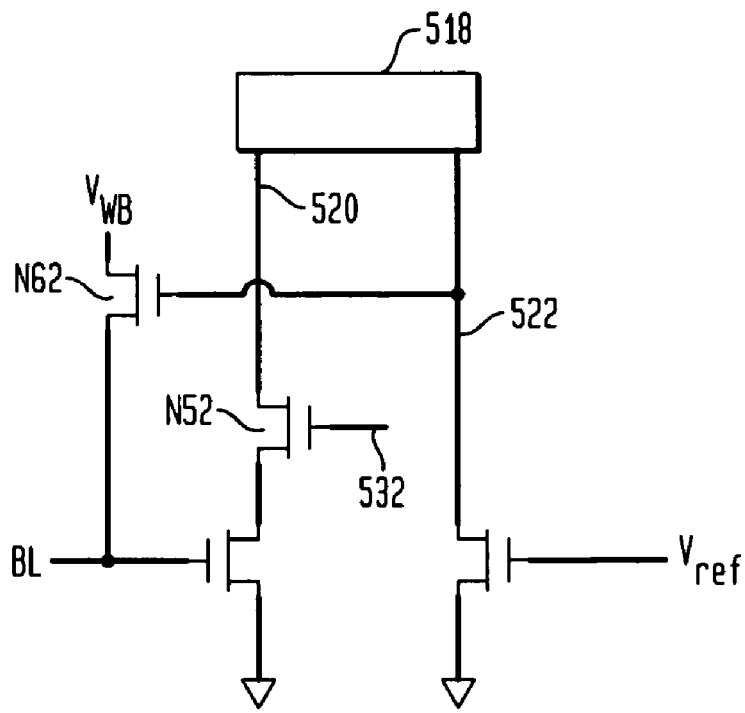

FIGS. 5A and 5B further illustrate circuit embodiments of the invention in which an additional select transistor N50, or N52 is provided in each circuit embodiment, respectively, for controlling when a particular bitline BL is connected to the sense amplifier 516 or 518 in each case. In such manner, the sense amplifier can be connected to sense the amplified signals from different bitlines or sections of a bitline, at different times, the particular bitline or bitline section being selected by a particular select signal 530 coupled to the select transistor N50 (FIG. 5A), or by a particular select signal 532 coupled to a select transistor (FIG. 5B).

In a preferred embodiment, a bitline of a memory array is divided into a plurality of bitline sections between which an embodiment as shown in FIG. 5A or 5B is provided, and connected to each respective bitline section. A single sense amplifier can then be used having a single line 512 coupled to all instances of the circuit embodiment of FIG. 5A for that bitline or a line 520 coupled to all instances of the embodiments of FIG. 5B for that bitline. Then, the selection transistors N50 or selection transistors N52 corresponding to each bitline section act together to multiplex the amplified bitline signals onto the lines 512 (FIG. 5A) or 520 (FIG. 5B).

FIG. 5A is similar to the embodiment shown and described above relative to FIG. 2A in which a timed writeback signal $V_{WB}$ is provided to a writeback NFET N60. FIG. 5B is similar to the embodiment shown and described above relative to FIG. 4A, in that it is a self-timed version with the line 522 being coupled to the gate of the writeback transistor N62.

In an example of operation of the embodiments shown in FIGS. 5A and 5B, the particular bitline BL must be selected by a select signal 530. When not selected by a select signal 530, the amplified signal from that bitline BL will not be sensed by sense amplifier 516.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of amplifying a signal by a transistor of an array of transistors including a storage cell transistor array of a dynamic random access memory (DRAM), comprising:
   providing an array of transistors including transistors of a storage cell transistor array of a dynamic random access memory array;
   connecting one of a source and a drain of a transistor of said array of transistors to a fixed potential; and
   applying an input signal to a gate of said transistor,
   whereby said transistor amplifies said input signal to provide an output signal appearing on the other of the source and the drain of said transistor.

2. The method of claim 1 wherein said fixed potential is ground, said input signal is applied as a voltage signal to said gate, and said output signal is inverted relative to said input signal.

3. The method of claim 1 wherein said fixed potential is a supply voltage, said input signal is applied to said gate as a voltage signal, and said output signal is non-inverted relative to said input signal.

4. The method of claim 1 wherein said input signal comprises a data bit signal from a bitline coupled to a storage cell currently accessed by said storage cell transistor array.

5. The method of claim 4 further comprising applying said output signal of said transistor as input to a sense amplifier external to said storage cell transistor array.

6. The method of claim 5 further comprising applying a reference signal as input to said sense amplifier, and differentially sensing a value of said output signal of said transistor in relation to said reference signal.

7. The method of claim 6 wherein said reference signal is generated by a reference transistor having a gate to which a reference voltage is applied.

8. The method of claim 7 wherein said reference voltage is a DC voltage.

9. The method of claim 7 wherein said reference voltage is applied to said gate of said reference transistor by a reference bitline of said storage cell array.

10. The method of claim 9 further comprising allowing a voltage of said reference bitline to float when applying said output signal of said transistor as input to said sense amplifier.

11. The method of claim 10 wherein said array of transistors include vertically oriented transistors and said transistor comprises a transistor of said vertically oriented transistors.

12. The method of claim 4 further comprising selecting said output signal from a plurality of signals output from a plurality of transistors including said transistor, and coupling said selected output signal to a sense amplifier external to said storage cell transistor array.

13. The method of claim 1 further comprising forming a well within a semiconductor substrate by a sequence of steps applied uniformly throughout a region of said semiconductor substrate, wherein said array of transistors including transistors of said storage cell transistor array are provided within said well.

14. An apparatus for amplifying a signal, comprising:
a first transistor of an array of transistors including transistors of a storage cell transistor array, all of said transistors of said array of transistors being located in a first well of a single crystal semiconductor substrate, said first transistor having a first source-drain region coupled to a fixed potential, a second source-drain region coupled to a conductive line, and a gate coupled to receive an input signal to be amplified,
whereby said first transistor is operable to amplify the input signal to provide an output signal onto said conductive line.

15. The apparatus of claim 14 wherein said fixed potential is ground, said input signal is a voltage signal and said output signal is inverted relative to said input signal.

16. The apparatus of claim 14 wherein said fixed potential is a supply voltage, said input signal is a voltage signal, and said output signal is not inverted relative to said input signal.

17. The apparatus of claim 14 wherein said input signal comprises a data bit signal from a bitline coupled to a source-drain region of a storage cell transistor of said storage cell transistor array.

18. The apparatus of claim 17 wherein said output signal is coupled to a sense amplifier external to said storage cell array.

19. The apparatus of claim 18 further comprising a second transistor of said array of transistors, said second transistor having a first source-drain region coupled to said bitline, a second source-drain region conductively coupled to said sense amplifier, and a gate coupled to a writeback control input,
whereby said second transistor is responsive to said writeback control input to apply a writeback signal from said sense amplifier to said bitline.

20. The apparatus of claim 14 wherein said array of transistors includes vertically oriented transistors and said first transistor comprises a transistor of said vertically oriented transistors.

21. The apparatus of claim 19 wherein said array of transistors includes vertically oriented transistors and wherein said second transistor comprises a transistor of said vertically oriented transistors.

22. The apparatus of claim 18 further comprising a selection transistor coupled between said first transistor and said sense amplifier, said selection transistor responsive to selection input to selectively connect said output signal of said first transistor to said sense amplifier.

23. The apparatus of claim 18 further comprising a reference transistor coupled to said sense amplifier, having a gate to which a reference voltage is applied.

24. The apparatus of claim 23 wherein said gate of said reference transistor is coupled to a reference bitline of said storage cell transistor array to provide said reference voltage.

* * * * *